United States Patent
Guo et al.

(10) Patent No.: US 10,802,630 B2
(45) Date of Patent: Oct. 13, 2020

(54) ARRAY SUBSTRATE, METHOD FOR FABRICATING THE SAME, DISPLAY PANEL, AND DISPLAY DEVICE

(71) Applicant: BOE TECHNOLOGY GROUP CO., LTD, Beijing (CN)

(72) Inventors: Yuzhen Guo, Beijing (CN); Xue Dong, Beijing (CN); Haisheng Wang, Beijing (CN); Chun-wei Wu, Beijing (CN); Xueyou Cao, Beijing (CN); Yingming Liu, Beijing (CN); Xiaoliang Ding, Beijing (CN); Chih-Jen Cheng, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 161 days.

(21) Appl. No.: 16/310,052

(22) PCT Filed: Jan. 11, 2018

(86) PCT No.: PCT/CN2018/072274
§ 371 (c)(1),
(2) Date: Dec. 14, 2018

(87) PCT Pub. No.: WO2018/233280
PCT Pub. Date: Dec. 27, 2018

(65) Prior Publication Data
US 2020/0012369 A1    Jan. 9, 2020

(30) Foreign Application Priority Data

Jun. 23, 2017   (CN) .......................... 2017 1 0488335

(51) Int. Cl.
*G06F 3/041* (2006.01)
*H01L 27/32* (2006.01)
(Continued)

(52) U.S. Cl.
CPC ........ *G06F 3/0412* (2013.01); *H01L 27/1214* (2013.01); *H01L 27/323* (2013.01);
(Continued)

(58) Field of Classification Search
CPC .. G06F 3/0412; H01L 27/323; H01L 41/1132; H01L 27/1214
See application file for complete search history.

(56) References Cited

U.S. PATENT DOCUMENTS 6,521,912 B1 *  2/2003  Sakama ............... G02B 27/017
                                                                    257/57
9,768,310 B2 *  9/2017  Ahn ..................... H01L 29/1604
(Continued)

FOREIGN PATENT DOCUMENTS

CN     105808001 A    7/2016
CN     105867688 A    8/2016
(Continued)

OTHER PUBLICATIONS

PCT, "International Search Report," issued in connection with Application No. PCT/CN2018/072274, dated Apr. 13, 2018, 6 pages.
(Continued)

*Primary Examiner* — Nitin Patel
*Assistant Examiner* — Robert M Stone
(74) *Attorney, Agent, or Firm* — Arent Fox LLP; Michael Fainberg

(57) ABSTRACT

The disclosure discloses an array substrate, a method for fabricating the same, a display panel, and a display device, and the array substrate includes: a base substrate, a pressure-sensitive component, a plurality of dual-gate transistors, and a plurality of pixel transistors, where the pressure-sensitive component includes a first electrode layer, a pressure-sensitive layer, and a second electrode layer which are arranged
(Continued)

on the base substrate in that order, and the second electrode layer includes a plurality of second electrodes arranged corresponding to the respective dual-gate transistors in a one-to-one manner; and the dual-gate transistors and the pixel transistors are arranged above the second electrode layer, and each of the plurality of second electrodes is electrically connected with a bottom-gate electrode in a corresponding dual-gate transistor, so that a pressure can be detected.

20 Claims, 12 Drawing Sheets

(51) Int. Cl.
*H01L 27/12* (2006.01)
*H01L 41/113* (2006.01)

(52) U.S. Cl.
CPC .............. *H01L 41/1132* (2013.01); *G06F 2203/04102* (2013.01); *G06F 2203/04105* (2013.01); *H01L 2251/5338* (2013.01)

(56) References Cited

U.S. PATENT DOCUMENTS

| | | | |
|---|---|---|---|
| 10,013,124 B2* | 7/2018 | Lou | G06F 3/044 |
| 10,297,695 B2* | 5/2019 | Zhang | H01L 29/423 |
| 10,510,969 B2* | 12/2019 | Maruyama | H01L 27/3248 |
| 10,620,731 B2* | 4/2020 | Lee | G06F 3/0445 |
| 2006/0152500 A1* | 7/2006 | Weng | G06F 3/045 |
| | | | 345/173 |
| 2008/0136990 A1* | 6/2008 | Kimura | G02F 1/136277 |
| | | | 349/46 |
| 2009/0115741 A1* | 5/2009 | Wang | G06F 3/044 |
| | | | 345/173 |
| 2010/0140614 A1* | 6/2010 | Uchiyama | H01L 27/11206 |
| | | | 257/43 |
| 2010/0213360 A1* | 8/2010 | Daiku | G01L 1/247 |
| | | | 250/231.19 |
| 2012/0138940 A1* | 6/2012 | Sato | H01L 27/124 |
| | | | 257/59 |
| 2012/0200546 A1* | 8/2012 | Miyamoto | H01L 29/78633 |
| | | | 345/205 |
| 2013/0088460 A1* | 4/2013 | Ahn | G06F 3/0412 |
| | | | 345/175 |
| 2014/0008203 A1 | 1/2014 | Nathan et al. | |
| 2014/0176494 A1* | 6/2014 | Huang | G02F 1/13394 |
| | | | 345/174 |
| 2014/0191221 A1* | 7/2014 | Benwadih | G01L 9/08 |
| | | | 257/40 |
| 2015/0084044 A1* | 3/2015 | Tanaka | H01L 29/66969 |
| | | | 257/43 |
| 2015/0123084 A1* | 5/2015 | Kim | H01L 27/1251 |
| | | | 257/40 |
| 2015/0261332 A1* | 9/2015 | Nakamura | G06F 3/0412 |
| | | | 345/173 |
| 2015/0380467 A1* | 12/2015 | Su | G06F 3/0412 |
| | | | 257/40 |
| 2016/0099258 A1* | 4/2016 | Yoneda | H01L 27/1225 |
| | | | 257/43 |
| 2016/0266706 A1* | 9/2016 | Lu | G06F 3/0412 |
| 2016/0282990 A1* | 9/2016 | Kimura | G02F 1/13338 |
| 2017/0062545 A1* | 3/2017 | Oh | H01L 27/3246 |
| 2017/0160841 A1* | 6/2017 | Lou | G06F 3/0412 |
| 2017/0284883 A1* | 10/2017 | Yang | G01L 9/08 |
| 2018/0181247 A1 | 1/2018 | Yang et al. | |
| 2018/0053795 A1* | 2/2018 | Lan | H01L 27/124 |
| 2018/0067592 A1* | 3/2018 | Kimura | G06F 3/0416 |
| 2018/0101268 A1 | 4/2018 | Li et al. | |
| 2018/0286989 A1 | 10/2018 | Zhang et al. | |
| 2018/0321788 A1* | 11/2018 | Kimura | G02F 1/133512 |
| 2019/0087046 A1 | 3/2019 | Guo et al. | |

FOREIGN PATENT DOCUMENTS

| | | |
|---|---|---|
| CN | 205750751 U | 11/2016 |
| CN | 205788139 U | 12/2016 |
| CN | 106328716 A | 1/2017 |
| CN | 106373977 A | 2/2017 |
| CN | 106531784 A | 3/2017 |
| CN | 106814912 A | 6/2017 |
| CN | 107195665 A | 9/2017 |
| JP | 2016121974 A | 7/2016 |

OTHER PUBLICATIONS

SIPO, "First Office Action," issued in connection with Application No. 201710488335.6, dated Apr. 30, 2019, 11 pages.

* cited by examiner

ARRAY SUBSTRATE, METHOD FOR FABRICATING THE SAME, DISPLAY PANEL, AND DISPLAY DEVICE

This application is a National Stage of International Application No. PCT/CN20018/072274, filed Jan. 11, 2018, which claims priority to Chinese Patent Application No. 201710488335.6, filed Jun. 23, 2017, both of which are hereby incorporated by reference in their entireties.

FIELD

The disclosure relates to the field of display technologies, and particularly to an array substrate, a method for fabricating the same, a display panel, and a display device.

BACKGROUND

A display with a Three Dimension Touch (3D-Touch) function is integrated with a pressure sensor, that is, a third Z-axis dimension is introduced besides a touch function, so some pressure-controlled actions can be added to the touch function of the display, where the pressure sensor integrated into the display can be embodied as a deformable capacitor or made of a deformable pressure-sensitive material, and generally structured simply of three layers, but it may be difficult for a simple sandwich-like structure to detect a pressure precisely, so resolution and sensitivity of detecting the pressure may be low.

SUMMARY

Embodiments of the disclosure provide an array substrate, a method for fabricating the same, a display panel, and a display device in the following solutions.

The embodiments of the disclosure provide an array substrate including: a base substrate, a pressure-sensitive component, a plurality of dual-gate transistors, and a plurality of pixel transistors, where: the pressure-sensitive component includes a first electrode layer, a pressure-sensitive layer, and a second electrode layer which are arranged on the base substrate in that order, and the second electrode layer includes a plurality of second electrodes arranged corresponding to the plurality of dual-gate transistors in a one-to-one manner; and the plurality of dual-gate transistors and the plurality of pixel transistors are arranged above the second electrode layer, and each of the plurality of second electrodes is electrically connected with a bottom-gate electrode in a corresponding dual-gate transistor.

Optionally in the array substrate above according to the embodiments of the disclosure, source-drain electrodes of the plurality of pixel transistors are arranged at a same layer as source-drain electrodes of the plurality of dual-gate transistors, active layers of the plurality of pixel transistors are arranged at a same layer as active layers of the plurality of dual-gate transistors, and gate electrodes of the plurality of pixel transistors are arranged at a same layer as top-gate electrodes or the bottom-gate electrodes of the plurality of dual-gate transistors.

Optionally in the array substrate above according to the embodiments of the disclosure, orthographic projections of the plurality of second electrodes onto the base substrate do not overlap with orthographic projections of source-drain electrodes in the plurality of dual-gate transistors onto the base substrate.

Optionally in the array substrate above according to the embodiments of the disclosure, the plurality of pixel transistors are top-gate transistors, and the gate electrodes of the plurality of pixel transistors are arranged at the same layer as the top-gate electrodes of the plurality of dual-gate transistors.

Optionally in the array substrate above according to the embodiments of the disclosure, each of the plurality of second electrodes is arranged at a same layer as, and structured integral to, a bottom-gate electrode electrically connected therewith.

Optionally in the array substrate above according to the embodiments of the disclosure, the plurality of pixel transistors are bottom-gate transistors, and the gate electrodes of the plurality of pixel transistors are arranged at the same layer as the bottom-gate electrodes of the plurality of dual-gate transistors.

Optionally in the array substrate above according to the embodiments of the disclosure, each of the plurality of second electrodes is electrically connected with the bottom-gate electrode in the corresponding dual-gate transistor through a via-hole.

Optionally in the array substrate above according to the embodiments of the disclosure, the plurality of pixel transistors are bottom-gate transistors.

Optionally in the array substrate above according to the embodiments of the disclosure, the first electrode layer is arranged on an entire surface of the base substrate as a whole.

Optionally in the array substrate above according to the embodiments of the disclosure, the first electrode layer includes a hollow region in an area corresponding to an active layer of each of the plurality of pixel transistors.

Optionally in the array substrate above according to the embodiments of the disclosure, the pressure-sensitive layer is arranged on an entire surface of the base substrate as a whole.

Optionally in the array substrate above according to the embodiments of the disclosure, the pressure-sensitive layer includes a hollow area, and an orthographic projection of the hollow area onto the base substrate does not overlap with orthographic projections of the plurality of second electrodes onto the base substrate.

Optionally in the array substrate above according to the embodiments of the disclosure, a material of the pressure-sensitive layer is a piezoelectric material; and the first electrode layer is configured to be applied with a first constant potential; each of the plurality of second electrodes is configured to apply a potential difference occurred when the piezoelectric material is being subjected to a pressure to the bottom-gate electrode in the corresponding dual-gate transistor; a top-gate electrode and a source electrode in each of the plurality of dual-gate transistors are configured to be applied with a second constant potential, and a drain electrode in each of the plurality of dual-gate transistors is configured to output a first pressure sensing potential.

Optionally in the array substrate above according to the embodiments of the disclosure, a material of the pressure-sensitive layer is a piezoresistive material; and the first electrode layer is configured to be applied with a first constant potential through a divider resistance; each of the plurality of second electrodes is configured to apply a potential difference occurred when the piezoresistive material is being subjected to a pressure to the bottom-gate electrode in the corresponding dual-gate transistor; a top-gate electrode and a source electrode in each of the plurality of dual-gate transistors are configured to be applied with a third constant potential; and a drain electrode in each of the plurality of dual-gate transistors is configured to output a second pressure sensing potential.

Embodiments of the disclosure further provide a display panel including the array substrate above according to the embodiments of the disclosure.

Optionally in the display panel above according to the embodiments of the disclosure, the display panel is a flexible organic electroluminescent display panel.

Embodiments of the disclosure further provide a display device including the display panel above according to the embodiments of the disclosure.

Embodiments of the disclosure further provide a method for fabricating the array substrate above according to the embodiments of the disclosure, the method including: fabricating the first electrode layer, the pressure-sensitive layer, and the second electrode layer constituting the pressure-sensitive component on the base substrate in that order, where the second electrode layer includes the plurality of second electrodes; and fabricating the plurality of pixel transistors, and the plurality of dual-gate transistors concurrently on the second electrode layer, where the plurality of dual-gate transistors are arranged corresponding to the plurality of second electrodes in a one-to-one manner, and each of the plurality of second electrodes is electrically connected respectively with a bottom-gate electrode in a corresponding dual-gate transistor.

Optionally in the method above according to the embodiments of the disclosure, when the plurality of pixel transistors are top-gate transistors, fabricating the second electrode layer on the pressure-sensitive layer includes: fabricating bottom-gate electrodes of the plurality of dual-gate transistors, and the second electrode layer respectively on the pressure-sensitive layer.

Optionally in the method above according to the embodiments of the disclosure, fabricating the plurality of pixel transistors, and the plurality of dual-gate transistors concurrently on the second electrode layer includes: fabricating active layers of the plurality of pixel transistors, and active layers of the plurality of dual-gate transistors respectively on the second electrode layer; fabricating a gate insulation layer on the active layers of the plurality of pixel transistors, and the active layers of the plurality of dual-gate transistors; fabricating top-gate electrodes of the plurality of pixel transistors, and top-gate electrodes of the plurality of dual-gate transistors respectively on the gate insulation layer; fabricating an interlayer insulation layer on the top-gate electrodes of the plurality of pixel transistors, and the top-gate electrodes of the plurality of dual-gate transistors; and fabricating source-drain electrodes of the plurality of pixel transistors, and source-drain electrodes of the plurality of dual-gate transistors respectively on the interlayer insulation layer.

Optionally in the method above according to the embodiments of the disclosure, when the plurality of pixel transistors are bottom-gate transistors, fabricating the plurality of pixel transistors, and the plurality of dual-gate transistors concurrently on the second electrode layer includes: fabricating bottom-gate electrodes of the plurality of pixel transistors, and bottom-gate electrodes of the plurality of dual-gate transistors respectively on the second electrode layer, where the bottom-gate electrodes of the plurality of dual-gate transistors are electrically connected with corresponding second electrodes through via-holes; fabricating a gate insulation layer on the bottom-gate electrodes of the plurality of pixel transistors, and the bottom-gate electrodes of the plurality of dual-gate transistors; fabricating active layers of the plurality of pixel transistors, and active layers of the plurality of dual-gate transistors respectively on the gate insulation layer; fabricating an interlayer insulation layer on the active layers of the plurality of pixel transistors, and the active layers of the plurality of dual-gate transistors; fabricating source-drain electrodes of the plurality of pixel transistors, and source-drain electrodes of the plurality of dual-gate transistors respectively on the interlayer insulation layer; and fabricating top-gate electrodes on the source-drain electrodes of the plurality of dual-gate transistors.

DETAILED DESCRIPTION OF THE EMBODIMENTS

Figure 1:
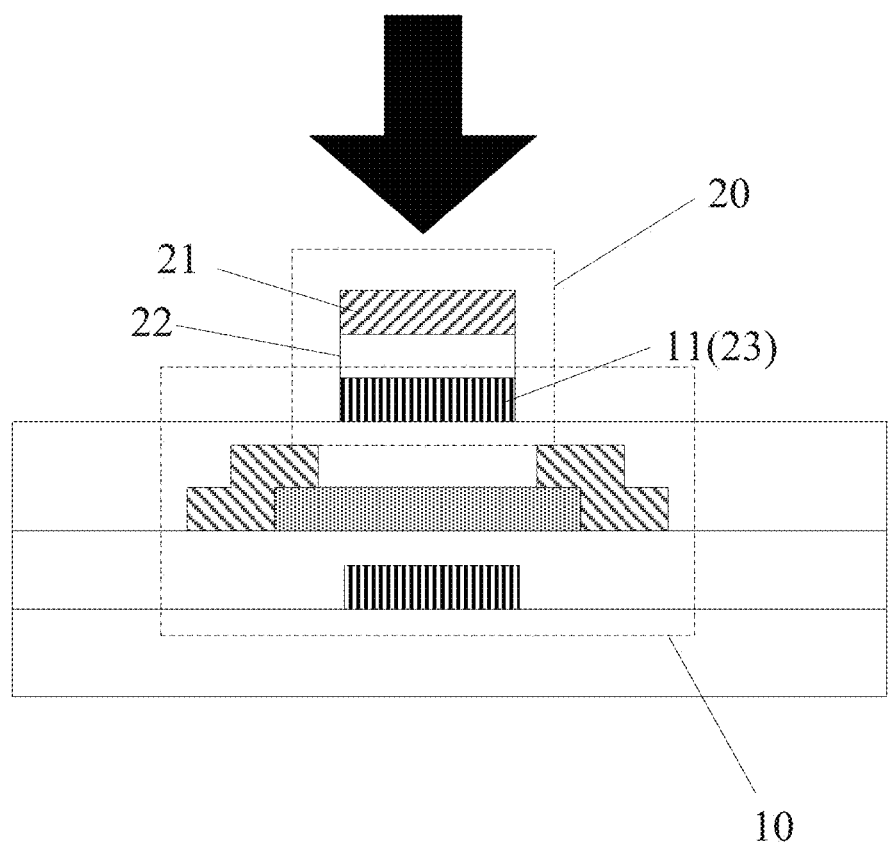
FIG. 1 is a schematic structural diagram of a pressure sensor in the related art.

A pressure sensor in the related art is a combination of a sandwich-like pressure-sensitive component and a dual-gate transistor. As illustrated in FIG. 1, a pressure-sensitive component 20 is arranged above a top-gate electrode 11 of a dual-gate transistor 10; the pressure-sensitive component 20 includes a first electrode 21, a pressure-sensitive layer 22 and a second electrode 23, and the second electrode 23 is reused as the top-gate electrode 11 of the dual-gate transistor 10. While the pressure-sensitive component 20 is being subjected to a pressure (as denoted by a black arrow), a potential difference is generated between the first electrode 21 and the second electrode 23, and acts on the top-gate electrode 11, so that a threshold voltage of the dual-gate transistor 10 drifts to output a pressure sensing potential, and a value of the pressure to which the pressure-sensitive component is subjected is calculated from the output pressure sensing potential. The pressure sensor in this structure can detect the pressure precisely to thereby greatly improve the precision and sensitivity of detecting the pressure.

However, if the structure as illustrated in FIG. 1 is integrated into a display, then in order not to affect an image from being displayed, the pressure-sensitive component has to be fabricated by patterning the pressure-sensitive layer and the first electrode, so a display panel has to be fabricated using more masks, thus complicating a fabrication process, greatly increasing a fabrication cost, and also greatly increasing difficulties of the fabrication process.

In view of this, the embodiments of the disclosure provide an array substrate, a method for fabricating the same, a display panel, and a display device, so that the fabrication process can be simplified, and the fabrication cost can be lowered, while guaranteeing high precision of pressure detection when a pressure-sensitive component and a dual-gate transistor are integrated into a display.

Implementations of the array substrate, the method for fabricating the same, the display panel, and the display device according to the embodiments of the disclosure will be described below in details with reference to the drawings. It shall be noted that the embodiments to be described are only a part but not all of the embodiments of the disclosure. Based upon the embodiments here of the disclosure, all the other embodiments which can occur to those ordinarily skilled in the art without any inventive effort shall fall into the claimed scope of the disclosure.

Figure 2:
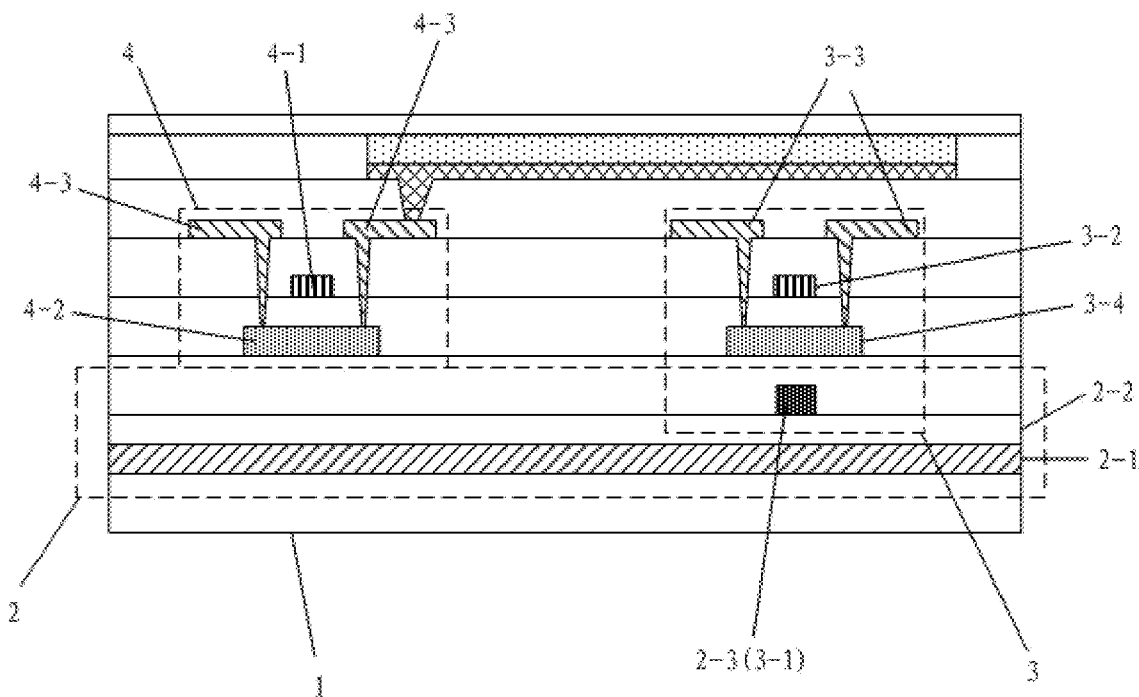
FIG. 2 to FIG. 4 are side views respectively of an array substrate according to the embodiments of the disclosure.
Figure 3:
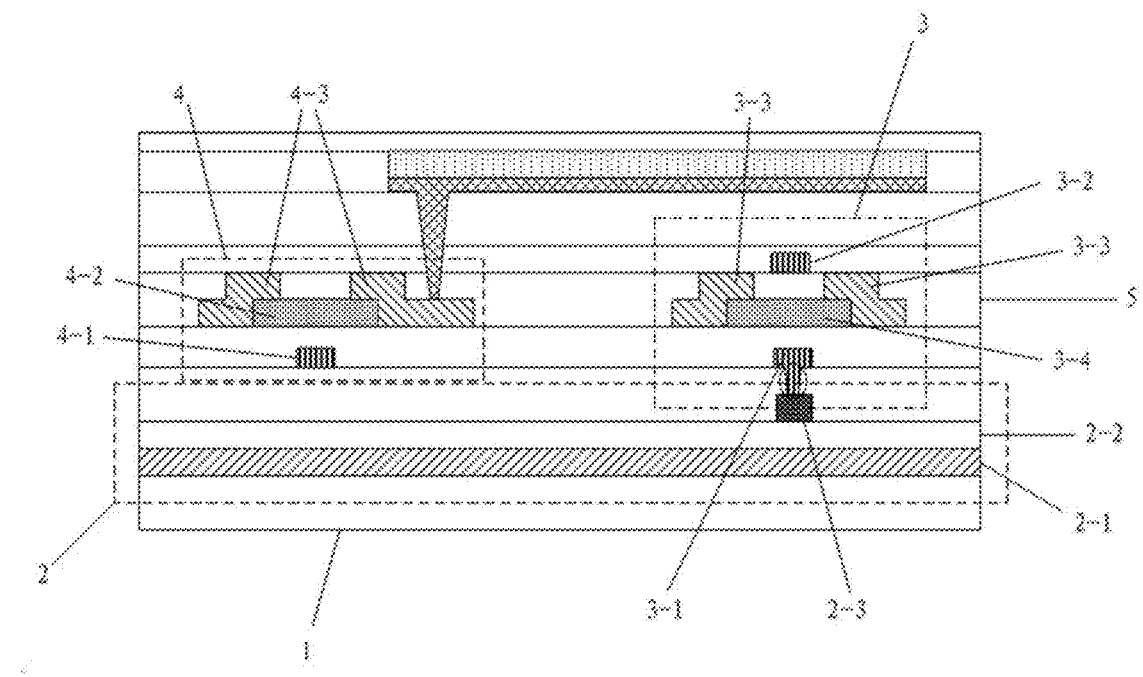
Figure 4:
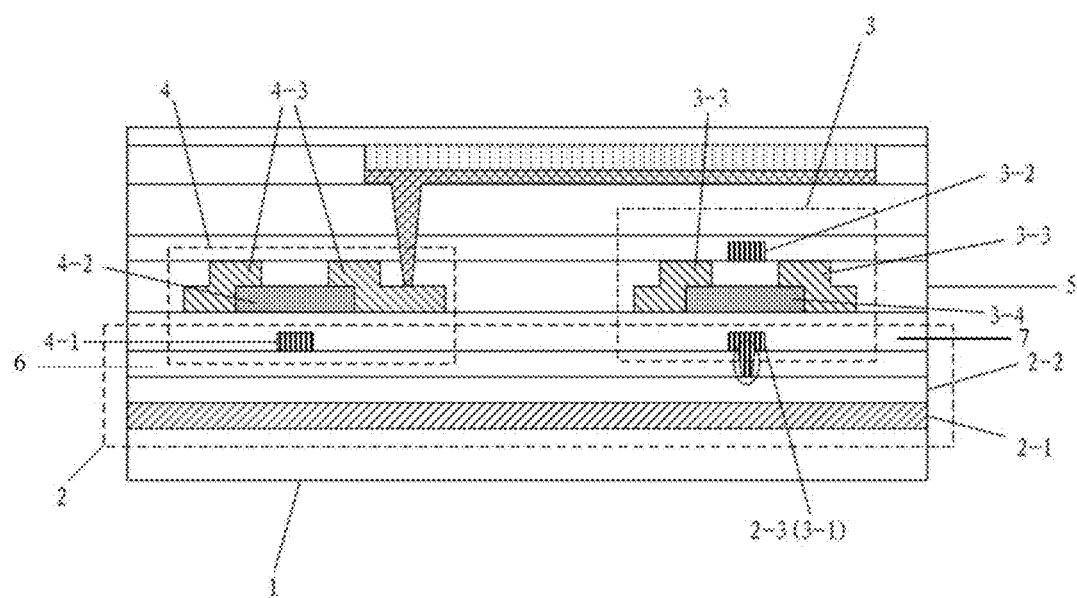

The embodiments of the disclosure provide an array substrate as illustrated in FIG. 2 to FIG. 4, which includes: a base substrate 1, a pressure-sensitive component 2, a plurality of dual-gate transistors 3, and a plurality of pixel transistors 4, although only one dual-gate transistor 3 and only one pixel transistor 4 are illustrated in FIG. 2 to FIG. 4.

The pressure-sensitive component 2 includes a first electrode layer 2-1, a pressure-sensitive layer 2-2, and a second electrode layer which are arranged on the base substrate 1 in that order; and the second electrode layer includes a plurality of second electrodes 2-3 arranged corresponding to the plurality of dual-gate transistors 3 in a one-to-one manner, although only one second electrode 2-3 is illustrated in FIG. 2 to FIG. 4.

The dual-gate transistors 3 and the pixel transistors 4 are arranged above the second electrode layer, and each second electrode 2-3 is electrically connected with a bottom-gate electrode 3-1 in a corresponding dual-gate transistor 3.

The array substrate above according to the embodiments of the disclosure is integrated with both the pressure-sensitive component and the dual-gate transistors so that precision of pressure detection can be greatly improved; and since the pressure-sensitive layer in the pressure-sensitive component is arranged between the dual-gate transistors and the base substrate, the pressure-sensitive layer will not be patterned to thereby simplify a fabrication process of the array substrate; and since both the dual-gate transistors and the pixel transistors are located above the second electrode layer, they can be fabricated together while the array substrate is being fabricated, to thereby reduce in effect the number of masks in use, simplify the fabrication process, and lower a fabrication cost.

Optionally, in the array substrate according to the embodiments of the disclosure, as illustrated in FIG. 2 to FIG. 4, each dual-gate transistor 3 includes two gate electrodes, which are a top-gate electrode 3-2 and a bottom-gate electrode 3-1. A source-drain electrode 4-3 of each pixel transistor 4 is arranged at the same layer as a source-drain electrode 3-3 of each dual-gate transistor 3; an active layer 4-2 of each pixel transistor 4 is arranged at the same layer as an active layer 3-4 of each dual-gate transistor 3; and a gate electrode 4-1 of each pixel transistor 4 is arranged at the same layer as the top-gate electrode 3-2 or the bottom-gate electrode 3-1 of each dual-gate transistor 3, so that the dual-gate transistors 3 and the pixel transistors 4 can be fabricated together, to thereby reduce in effect the number of masks in use, simplify the fabrication process, and lower a fabrication cost.

In a particular implementation, as illustrated in FIG. 2, each pixel transistor 4 is a top-gate transistor, or as illustrated in FIG. 3 and FIG. 4, each pixel transistor 4 is a bottom-gate transistor, although the embodiments of the disclosure will not be limited thereto.

Optionally, in the array substrate above according to the embodiments of the disclosure, as illustrated in FIG. 3 and FIG. 4, when each pixel transistor 4 is a bottom-gate transistor, the gate electrode 4-1 of each pixel transistor 4 is arranged at the same layer as the bottom-gate electrode 1 of each dual-gate transistor 3.

Optionally, in the array substrate above according to the embodiments of the disclosure, as illustrated in FIG. 3 and FIG. 4, when each pixel transistor 4 is a bottom-gate transistor, the gate electrode 4-1 of each pixel transistor 4 is arranged at the same layer as the bottom-gate electrode 3-2 of each dual-gate transistor 3.

Optionally, in the array substrate above according to the embodiments of the disclosure, as illustrated in FIG. 3, each second electrode 2-3 is electrically connected with a bottom-gate electrode 3-1 through a via hole (as denoted in a solid line frame).

Figure 5A:
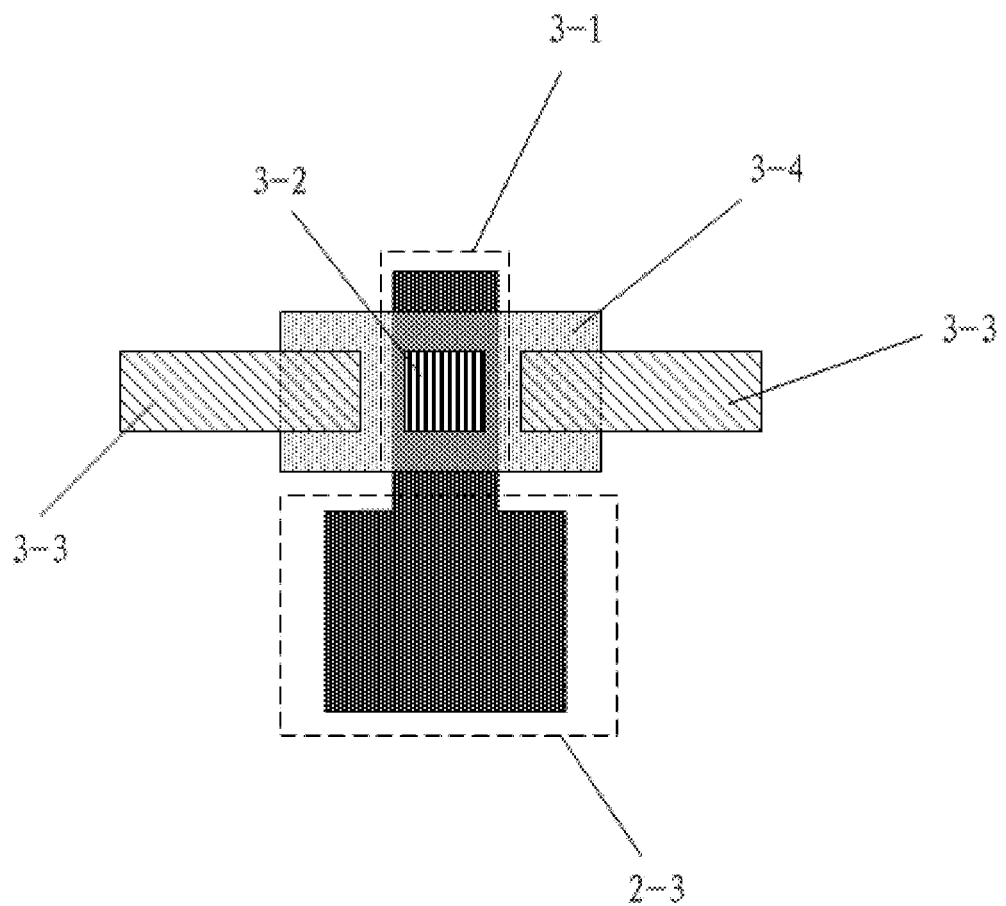
FIG. 5A and FIG. 5B are side views respectively of a dual-gate transistor and a second electrode according to the embodiments of the disclosure.
Figure 5B:
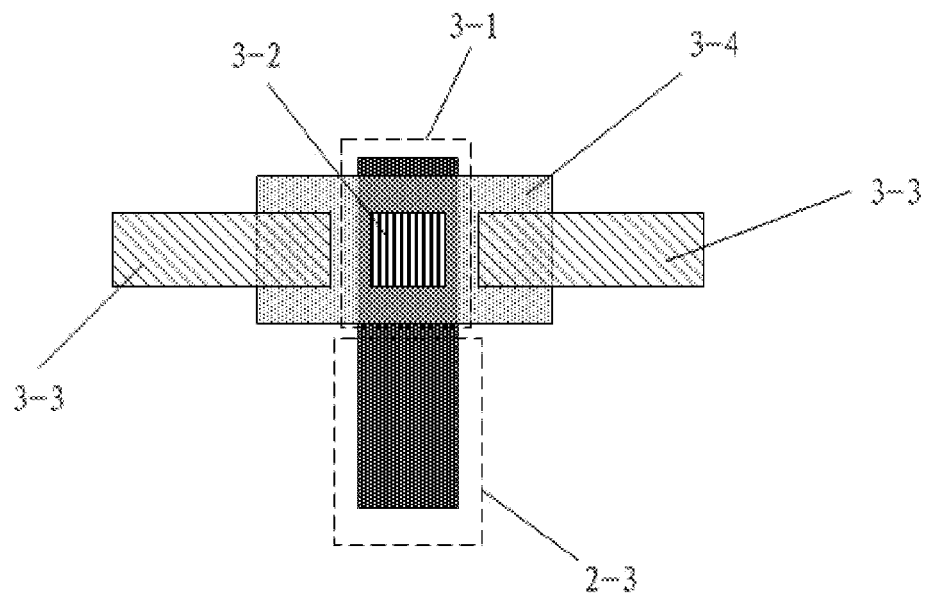

Optionally, in the array substrate above according to the embodiments of the disclosure, as illustrated in FIG. 2, when each pixel transistor 4 is a top-gate transistor, each second electrode 2-3 can be arranged at the same layer as, and structured integral to a bottom-gate electrode 3-1 electrically connected therewith, that is, the bottom-gate electrode 3-1 in each dual-gate transistor 3 is reused as a second electrode 2-3 in the pressure-sensitive component 2. This is because when each pixel transistor 4 is a top-gate transistor, the gate electrode 4-1 thereof is located between an active layer 4-2 and a source-drain electrode 4-3, so the array substrate can be fabricated by fabricating the top-gate electrode 3-2 in each dual-gate transistor 3 together with the gate electrode 4-1 in each pixel transistor 4, and arranging the bottom-gate electrode 3-1 in each dual-gate transistor 3 at the same layer as, and structuring it integral to, a second electrode 2-3 in the pressure-sensitive component 2. As illustrated in FIG. 5A, the bottom-gate electrode 3-1 in each dual-gate transistor 3 is located at the same layer as, and structured integral to, a second electrode 2-3, to thereby reduce the number of masks in use, and simplify the fabrication process. Of course, a shape of each second electrode 2-3 will not be limited to a shape as illustrated in FIG. 5A, but can alternatively be another structure (as illustrated in FIG. 5B) as long as when each pixel transistor 4 is a top-gate transistor, the bottom-gate electrode 3-1 in each dual-gate transistor 3 is arranged at the same layer as, and structured integral to, a second electrode 2-3, although the embodiments of the disclosure will not be limited thereto.

Particularly, when each pixel transistor is a top-gate transistor, a material of active layers in each pixel transistor and each dual-transistor is generally a low-temperature poly-silicon, that is, the active layers are fabricated using the Low-Temperature Poly-Silicon (LTPS) technology, to thereby guarantee excellent semiconductor performances of the pixel transistor and the dual-transistor.

Particularly, in the array substrate above according to the embodiments of the disclosure, when each pixel transistor is a bottom-gate transistor, as illustrated in FIG. 3, since each pixel transistor 4 is a bottom-gate transistor, the gate electrode 4-1 therein is located between an active layer 4-2 and the base substrate 1, so the array substrate can be fabricated by fabricating the bottom-gate electrode 3-1 in each dual-gate transistor 3 together with the gate electrode 4-1 in each pixel transistor 4. Moreover in order to avoid the pressure-sensitive layer 2-2 corning into contact with the gate electrode 4-1 of each pixel transistor 4, a first insulation layer 6 is arranged between each second electrode 2-3, and the gate electrode 4-1 of each pixel transistor 4, so that each second electrode 2-3 can be electrically connected with a bottom-gate electrode 3-1 through a via hole (as denoted in the solid line frame), that is, the via hole extends through the first insulation layer 6.

Figure 6:
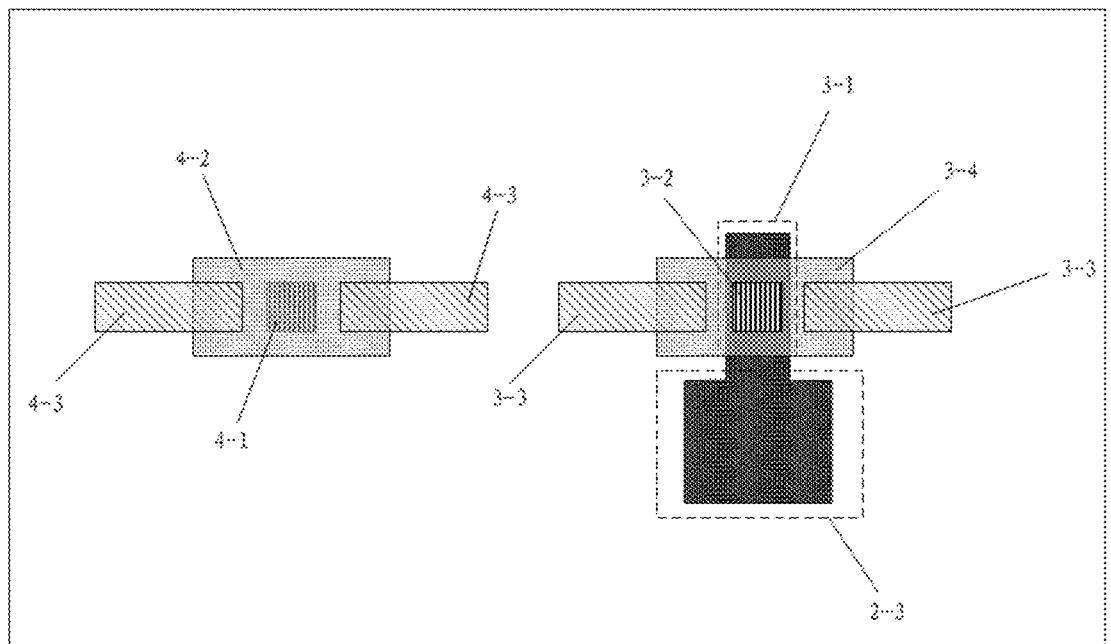
FIG. 6 is a top view of a dual-gate transistor, a pixel transistor, and a second electrode according to the embodiments of the disclosure.

Particularly, when each pixel transistor 4 is a top-gate transistor, as illustrated in FIG. 4, alternatively each second electrode 2-3, the bottom-gate electrode 3-1 in each dual-gate transistor 3, and the gate electrode 4-1 in each pixel transistor 4 are arranged at the same layer, that is, the bottom-gate electrode 3-1 in each dual-gate transistor 3 is reused as a second electrode 2-3. In a top view as illustrated in FIG. 6, the gate electrode 4-1 in each pixel transistor 4 is insulated respectively from the bottom-gate electrode 3-1 in each dual-gate transistor 3, and each second electrode 2-3; the bottom-gate electrode 3-1 in each dual-gate transistor 3 is electrically connected with a second electrode 2-3 and structured integral to the second electrode 2-3; and at this time, the second electrode 2-3 shall be connected with the pressure-sensitive layer 2-2 through a via hole (as denoted in the solid line frame) extending through the first insulation layer 6, so that a potential difference occurred when the pressure-sensitive layer 2-2 is subjected to a pressure acts on the corresponding dual-gate transistor 3 through the second electrode 2-3.

Furthermore, in the array substrate as illustrated in FIG. 3 and FIG. 4, since each pixel transistors 4 is a bottom-gate transistor, the gate electrode 4-1 of each pixel transistor 4 is fabricated together with the bottom-gate electrode 3-1 of each dual-gate transistor 3, so that after the source-drain electrode 4-3 of each pixel transistor 4, and the source-drain electrode 3-3 of each dual-gate transistor 3 are fabricated, a top-gate electrode 3-2 is fabricated above the source-drain electrode 3-3 of each dual-gate transistor 3, thus finishing fabricating the dual-gate transistors 3; and a gate insulation layer 7 is made of the same material as an interlayer insulation layer 5 in the same thickness as the interlayer insulation layer 5 to thereby guarantee a semiconductor performance of the dual-gate transistors 3 so as to detect a pressure precisely.

Particularly, when each pixel transistor is a bottom-gate transistor, a material of active layers in each pixel transistor and each dual-gate transistor is generally amorphous silicon (a-Si) or an oxide to thereby guarantee excellent semiconductor performances of the pixel transistor and the dual-gate transistor.

Optionally, since each dual-gate transistor and each pixel transistor are fabricated in such a way that a part of their layers are fabricated together, so each pixel transistor can alternatively be arranged as a dual-gate transistor besides a top-gate transistor or a bottom-gate transistor, although the embodiments of the disclosure will not be limited thereto.

Optionally, in order to avoid a potential signal in each second electrode interfering with a signal of a source-drain electrode in a dual-gate transistor so as to alleviate an influence on an image being displayed, in the array substrate above according to the embodiments of the disclosure, an orthographic projection of each second electrode 2-3 onto the base substrate does not overlap with an orthographic projection of a source-drain electrode 3-3 in a corresponding dual-gate transistor 3 onto the base substrate as illustrated in FIG. 5A, FIG. 5B and FIG. 6.

In a particular implementation, in order to simplify a fabrication process of the array substrate, the first electrode layer can completely cover the base substrate, that is, the first electrode layer is arranged on an entire surface of the base substrate as a whole; but while a display panel in this structure is in operation, a parasitic capacitance may be formed between the first electrode layer and the active layer in each pixel transistor, thus adversely affecting a semiconductor performance of the pixel transistor, and degrading a display function of the display panel, so in order to avoid this problem, the first electrode layer can be patterned.

Figure 7A:
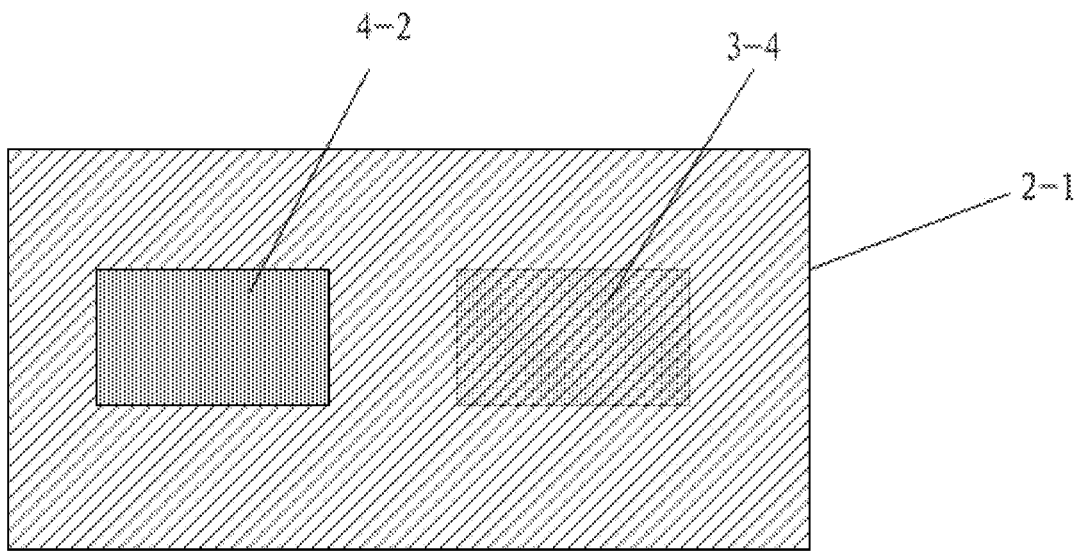
FIG. 7A and FIG. 7B are top views respectively of a first electrode layer according to the embodiments of the disclosure.
Figure 7B:
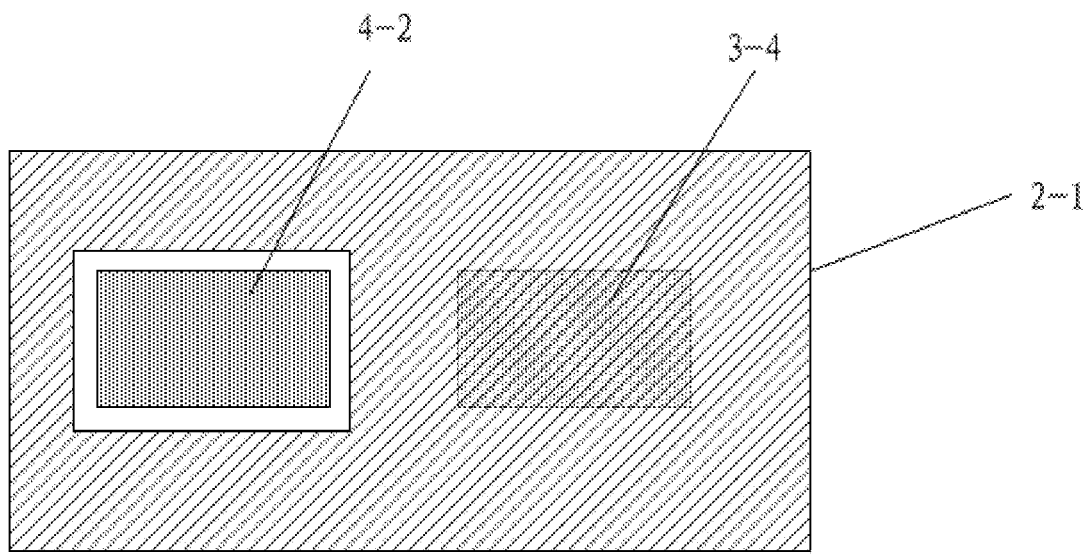

Optionally, in the array substrate above according to the embodiments of the disclosure, the first electrode layer has a hollow region in an area corresponding to the active layer of each pixel transistor; and particularly while the array substrate is being observed from the base substrate side, FIG. 7A and FIG. 7B illustrate positional relationships among the first electrode layer, the active layer of each pixel transistor, and the active layer of each dual-gate transistor in top views, where 4-2 represents an active layer of a pixel transistor, 4 represents an active layer of a dual-gate transistor, and 2-1 represents the first electrode layer; and the active layer of only one pixel transistor, and the active layer of only one dual-gate transistor are illustrated. Only an area corresponding to the active layer 4-2 in each pixel transistor 4 is arranged as a hollow region to thereby avoid a parasitic capacitance from being formed between the first electrode layer 2-1, and the active layer 4-2 in each pixel transistor 4, so as not to hinder an image from being displayed. And an orthographic projection of each hollow region onto the base substrate can completely overlap with an orthographic projection of a corresponding pixel transistor 4 onto the base substrate, so the hollow region is invisible in the top view as illustrated in FIG. 7A; or an orthographic projection of each pixel transistor 4 onto the base substrate lies into an orthographic projection of a corresponding hollow region onto the base substrate as illustrated in FIG. 7B, where a blank area represents a hollow region. Of course, as found through experiments, if a parasitic capacitance formed between the first electrode layer, and the active layer in each pixel transistor has an insignificant influence on a semiconductor performance of the pixel transistor, then the first electrode layer will be integrally arranged on the base substrate instead of being patterned.

Optionally, in order to simplify a fabrication process of the array substrate, the pressure-sensitive layer can completely cover the first electrode layer, that is, the pressure-sensitive layer is arranged on an entire surface of the first electrode layer as a whole; but while the pressure-sensitive component in this structure is being subjected to an external pressure, the pressure is concentrated so that the pressure-sensitive layer tends to break off, thus degrading precision of detecting the pressure; so in order to avoid this problem, in the array substrate above according to the embodiments of the disclosure, the pressure-sensitive layer includes a hollow area, and an orthographic projection of the hollow area onto the base substrate does not overlap with an orthographic projection of each second electrode onto the base substrate; that is, the orthographic projection of each second electrode onto the base substrate shall overlap with an orthographic projection of the pressure-sensitive layer onto the base substrate to thereby enable external pressure to be detected in effect. Of course, a size of the hollow area will not be limited thereto as long as the orthographic projection of the hollow area onto the base substrate does not overlap with the orthographic projection of each second electrode onto the base substrate.

Figure 8:
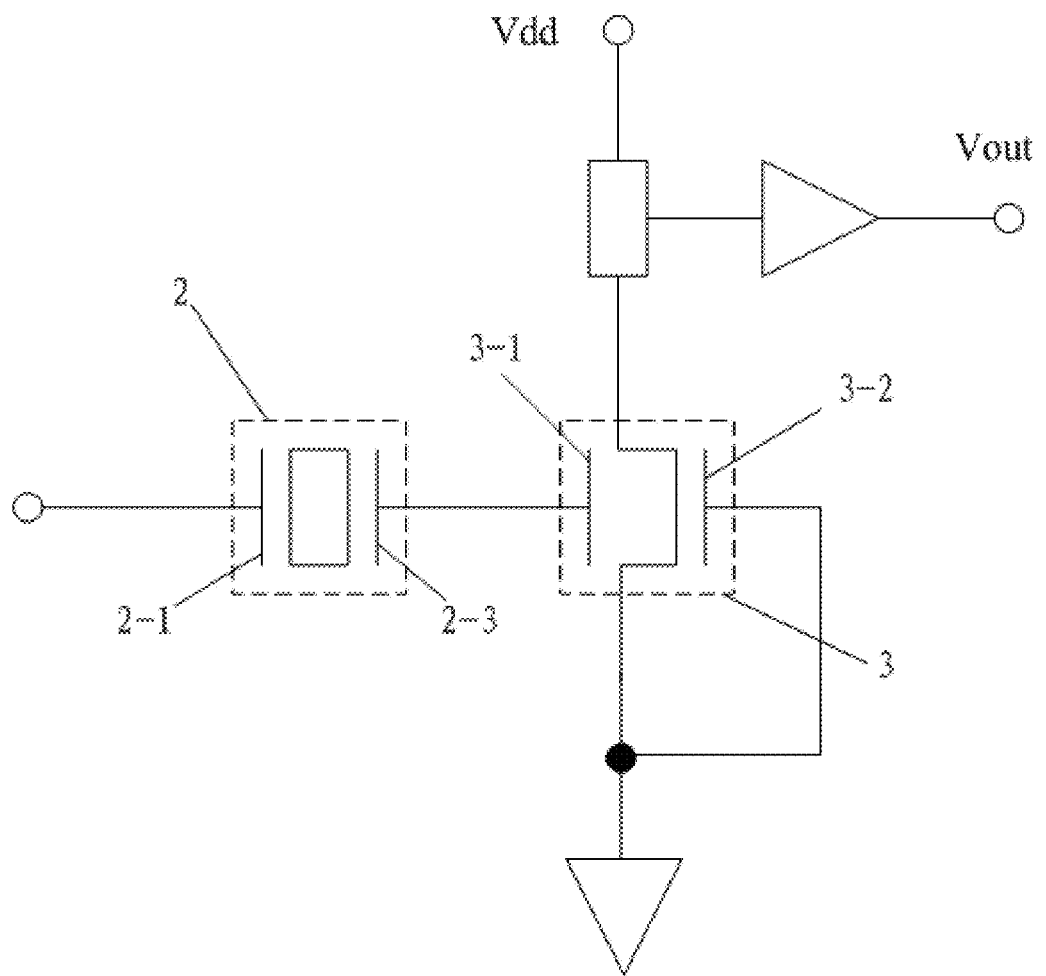
FIG. 8 and FIG. 9 are equivalent circuit diagrams of a pressure-sensitive component and a dual-gate transistor according to the embodiments of the disclosure.

Optionally, in order for a potential difference to occur between the first electrode layer and a second electrode while the pressure-sensitive component is being subjected to an external pressure, a pressure-sensitive material can be a piezoelectric material or a piezoresistive material, where when a material of the pressure-sensitive layer is the piezoelectric material, positive-negative charges in the piezoelectric material being subjected to external pressure are separated at centers thereof due to a characteristic of the piezoelectric material, so that positive charges and negative charges are collected respectively in the first electrode layer and the second electrode, to thereby generate the potential difference between the first electrode layer and the second electrode; and then the potential difference acts on a dual-gate transistor electrically connected with the second electrode through a bottom-gate electrode in the dual-gate transistor. Particularly FIG. 8 illustrates an equivalent circuit diagram thereof, where a first constant potential is applied to the first electrode layer 2-1; a potential difference generated when the piezoelectric material is being subjected to a pressure acts on the bottom-gate electrode 3-1 through the second electrode 2-3; a second constant potential is applied respectively to the top-gate electrode 3-2 and a source electrode in the dual-gate transistor 3, and a drain electrode in the dual-gate transistor 3 outputs a first pressure sensing potential Vout; and the first constant potential can be a zero potential or another constant potential, although the embodiments of the disclosure will not be limited thereto.

Figure 9:
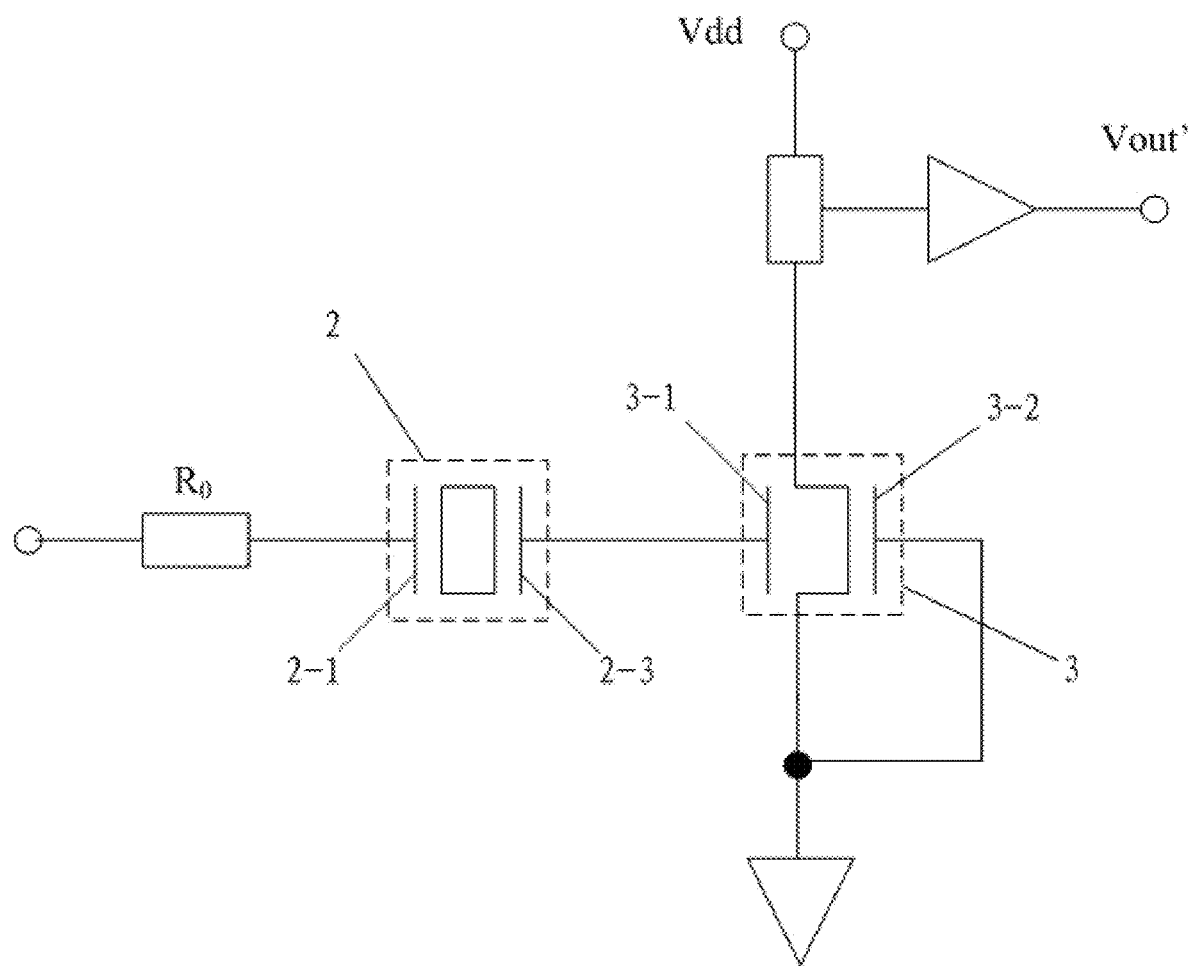

Optionally, when the material of the pressure-sensitive layer is the piezoresistive material, a resistance of the piezoresistive material being subjected to an external pressure may be changed due to a characteristic of the piezoresistive material, so that a potential difference is occurred between the first electrode layer and the second electrode; and then the potential difference acts on the dual-gate transistor electrically connected with the second electrode through the bottom-gate electrode in the dual-gate transistor. Particularly FIG. 9 illustrates an equivalent circuit diagram thereof, where a first constant potential is applied to the first electrode layer 2-1 through a divider resistance $R_0$; a potential difference occurred when the piezoresistive material is being subjected to a pressure acts on the bottom-gate electrode 3-1 through the second electrode 2-3; a third constant potential is applied respectively to the top-gate electrode 3-2 and the source electrode in the dual-gate transistor 3, and the drain electrode in the dual-gate transistor 3 outputs a second pressure sensing potential Vout'.

Figure 10:
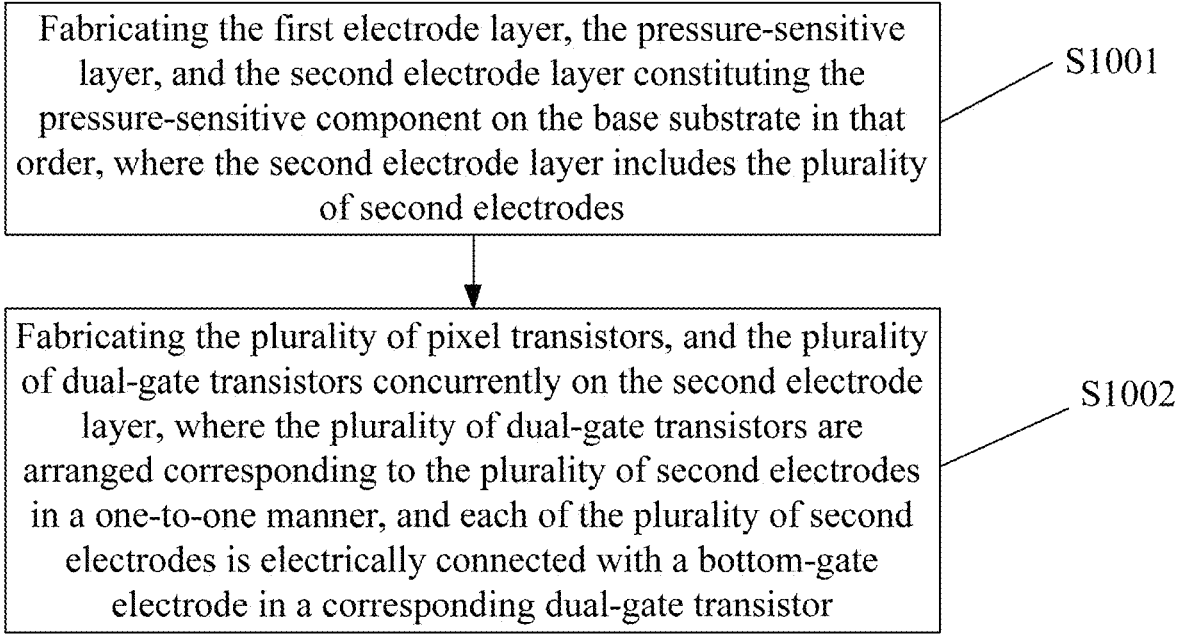
FIG. 10 to FIG. 13 are flow charts respectively of a method for fabricating an array substrate according to the embodiments of the disclosure.

Based upon the same inventive idea, the embodiments of the disclosure further provide a method for fabricating the array substrate above according to the embodiments of the disclosure, and as illustrated in FIG. 10, the method includes the following operations.

The operation S1001 is to fabricate the first electrode layer, the pressure-sensitive layer, and the second electrode layer constituting the pressure-sensitive component on the base substrate in that order, where the second electrode layer includes the plurality of second electrodes.

The operation S1002 is to fabricate the plurality of pixel transistors, and the plurality of dual-gate transistors concurrently on the second electrode layer, where the plurality of dual-gate transistors are arranged corresponding to the plurality of second electrodes in a one-to-one manner, and each of the plurality of second electrodes is electrically connected with a bottom-gate electrode in a corresponding dual-gate transistor.

In a particular implementation, in the operation S1001 of the method above according to the embodiments of the disclosure, when the plurality of pixel transistors are top-gate transistors, fabricating the second electrode layer on the pressure-sensitive layer includes: fabricating bottom-gate electrodes of the plurality of dual-gate transistors, and the second electrode layer respectively on the pressure-sensitive layer.

In a particular implementation, in the operation S1002 of the method above according to the embodiments of the disclosure, fabricating the plurality of pixel transistors, and the plurality of dual-gate transistors concurrently on the second electrode layer includes: fabricating active layers of the plurality of pixel transistors, and active layers of the plurality of dual-gate transistors respectively on the second electrode layer; fabricating a gate insulation layer on the active layers of the plurality of pixel transistors, and the active layers of the plurality of dual-gate transistors; fabricating top-gate electrodes of the plurality of pixel transistors, and top-gate electrodes of the plurality of dual-gate transistors respectively on the gate insulation layer; fabricating an interlayer insulation layer on the top-gate electrodes of the plurality of pixel transistors, and the top-gate electrodes of the plurality of dual-gate transistors; and fabricating source-drain electrodes of the plurality of pixel transistors, and source-drain electrodes of the plurality of dual-gate transistors respectively on the interlayer insulation layer.

In a particular implementation, in the operation S1002 of the method above according to the embodiments of the disclosure, when the plurality of pixel transistors are bottom-gate transistors, fabricating the plurality of pixel transistors, and the plurality of dual-gate transistors concurrently on the second electrode layer includes: fabricating bottom-gate electrodes of the plurality of pixel transistors, and bottom-gate electrodes of the plurality of dual-gate transistors respectively on the second electrode layer, where the bottom-gate electrodes of the plurality of dual-gate transistors are electrically connected with corresponding second electrodes through via-holes; fabricating a gate insulation layer on the bottom-gate electrodes of the plurality of pixel transistors, and the bottom-gate electrodes of the plurality of dual-gate transistors; fabricating active layers of the plurality of pixel transistors, and active layers of the plurality of dual-gate transistors respectively on the gate insulation layer; fabricating an interlayer insulation layer on the active layers of the plurality of pixel transistors and the active layers the plurality of dual-gate transistors; fabricating source-drain electrodes of the plurality of pixel transistors, and source-drain electrodes of the plurality of dual-gate transistors respectively on the interlayer insulation layer; and fabricating top-gate electrodes on the source-drain electrodes of the plurality of dual-gate transistors.

The method above according to the embodiments of the disclosure will be described below in details in connection with particular embodiments thereof.

Figure 11:
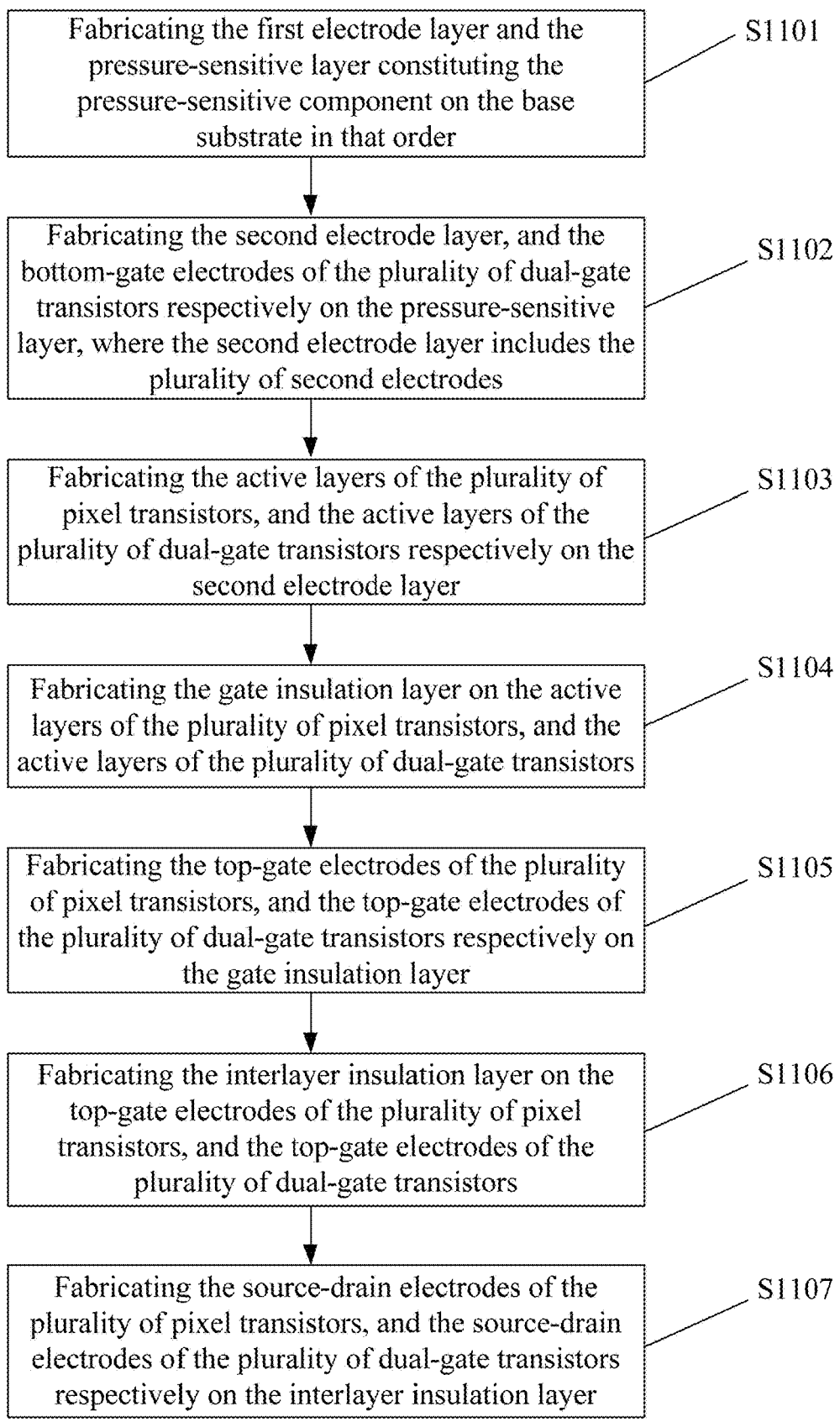

Optionally, the method above according to the embodiments of the disclosure will be described in details via following operations with reference to a flow chart of the method as illustrated in FIG. 11 and a structure of the array substrate as illustrated in FIG. 2.

The operation S1101 is to fabricate the first electrode layer and the pressure-sensitive layer constituting the pressure-sensitive component on the base substrate in that order.

The operation 51102 is to fabricate the second electrode layer, and the bottom-gate electrodes of the plurality of dual-gate transistors respectively on the pressure-sensitive layer, where the second electrode layer includes the plurality of second electrodes.

The operation 51103 is to fabricate the active layers of the plurality of pixel transistors, and the active layers of the plurality of dual-gate transistors respectively on the second electrode layer.

The operation S1104 is to fabricate the gate insulation layer on the active layers of the plurality of pixel transistors, and the active layers of the plurality of dual-gate transistors.

The operation S1105 is to fabricate the top-gate electrodes of the plurality of pixel transistors, and the top-gate electrodes of the plurality of dual-gate transistors respectively on the gate insulation layer.

The operation S1106 is to fabricate the interlayer insulation layer on the top-gate electrodes of the plurality of pixel transistors, and the top-gate electrodes of the plurality of dual-gate transistors.

And the operation S1107 is to fabricate the source-drain electrodes of the plurality of pixel transistors, and the source-drain electrodes of the plurality of dual-gate transistors respectively on the interlayer insulation layer.

Figure 12:
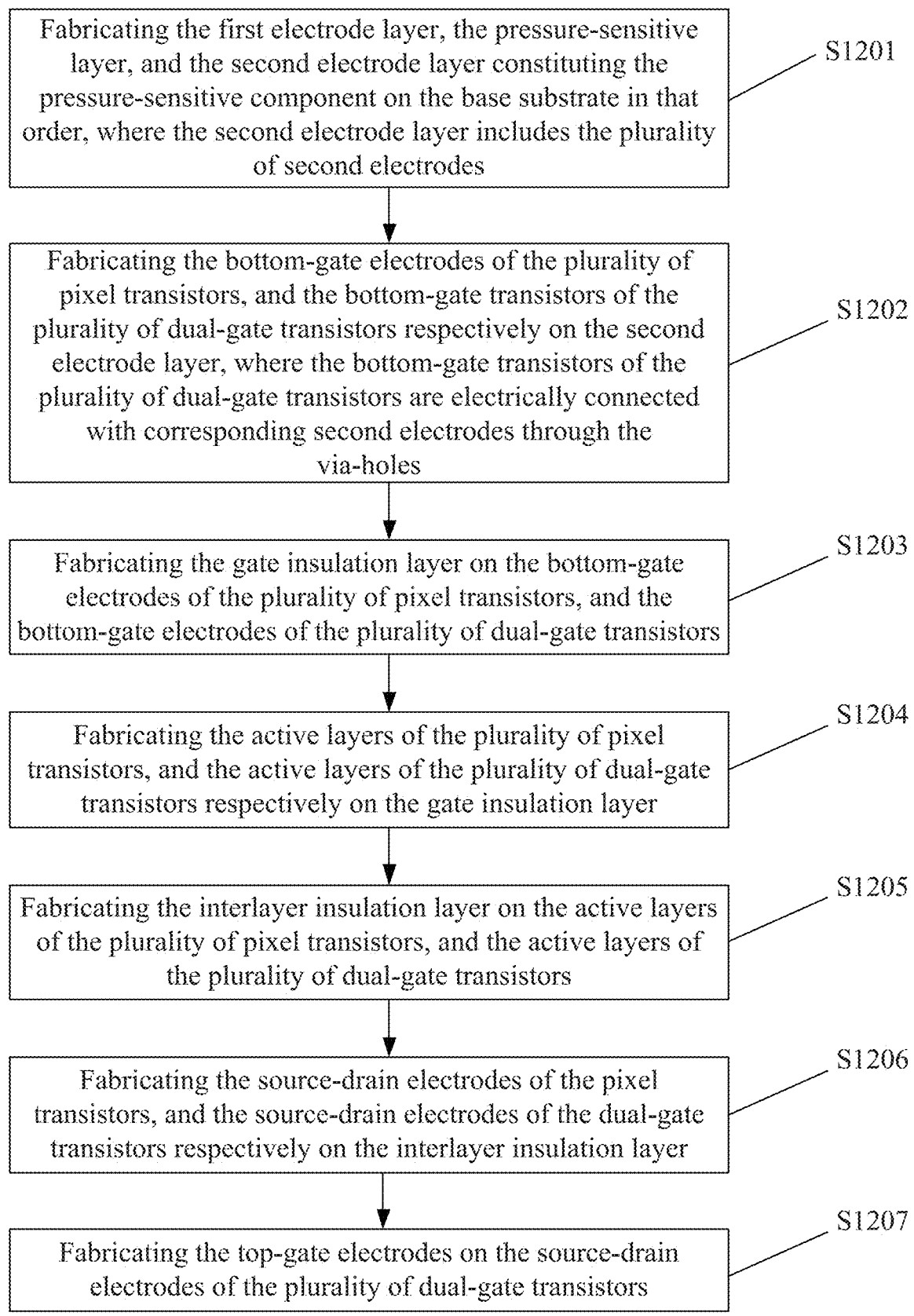

Optionally the method above according to the embodiments of the disclosure will be described in details via following operations with reference to a flow chart of the method as illustrated in FIG. 12 and a structure of the array substrate as illustrated in FIG. 3.

The operation S1201 is to fabricate the first electrode layer, the pressure-sensitive layer, and the second electrode layer constituting the pressure-sensitive component on the base substrate in that order, where the second electrode layer includes the plurality of second electrodes.

The operation S1202 is to fabricate the bottom-gate electrodes of the plurality of pixel transistors, and the bottom-gate transistors of the plurality of dual-gate transistors respectively on the second electrode layer, where the bottom-gate transistors of the plurality of dual-gate transistors are electrically connected with corresponding second electrodes through the via-holes.

The operation S1203 is to fabricate the gate insulation layer on the bottom-gate electrodes of the plurality of pixel transistors, and the bottom-gate electrodes of the plurality of dual-gate transistors.

The operation S1204 is to fabricate the active layers of the plurality of pixel transistors, and the active layers of the plurality of dual-gate transistors respectively on the gate insulation layer.

The operation 51205 is to fabricate the interlayer insulation layer on the active layers of the plurality of pixel transistors, and the active layers of the plurality of dual-gate transistors.

The operation S1206 is to fabricate the source-drain electrodes of the pixel transistors, and the source-drain electrodes of the dual-gate transistors respectively on the interlayer insulation layer.

And the operation S1207 is to fabricate the top-gate electrodes on the source-drain electrodes of the plurality of dual-gate transistors.

Figure 13:
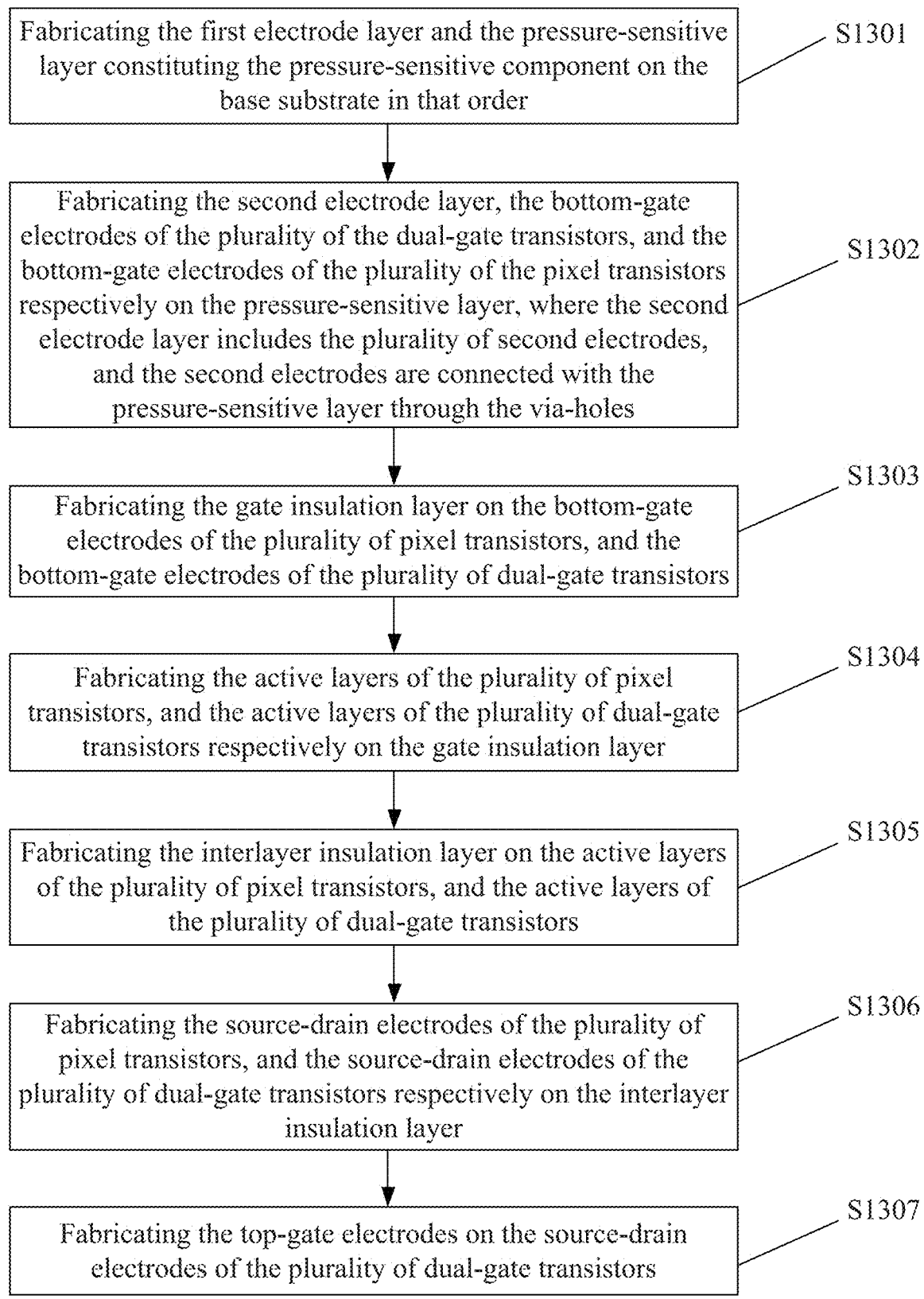

Optionally the method above according to the embodiments of the disclosure will be described in details via following operations with reference to a flow chart of the method as illustrated in FIG. 13 and a structure of the array substrate as illustrated in FIG. 4.

The operation 51301 is to fabricate the first electrode layer and the pressure-sensitive layer constituting the pressure-sensitive component on the base substrate in that order.

The operation S1302 is to fabricate the second electrode layer, the bottom-gate electrodes of the plurality of dual-gate transistors, and the bottom-gate electrodes of the plurality of pixel transistors respectively on the pressure-sensitive layer, where the second electrode layer includes the plurality of second electrodes, and the second electrodes are connected with the pressure-sensitive layer through the via-holes.

The operation 51303 is to fabricate the gate insulation layer on the bottom-gate electrodes of the plurality of pixel transistors, and the bottom-gate electrodes of the plurality of dual-gate transistors.

The operation S1304 is to fabricate the active layers of the plurality of pixel transistors, and the active layers of the plurality of dual-gate transistors respectively on the gate insulation layer.

The operation 51305 is to fabricate the interlayer insulation layer on the active layers of the plurality of pixel transistors, and the active layers of the plurality of dual-gate transistors.

The operation S1306 is to fabricate the source-drain electrodes of the plurality of pixel transistors, and the source-drain electrodes of the plurality of dual-gate transistors respectively on the interlayer insulation layer.

And the operation S1307 is to fabricate the top-gate electrodes on the source-drain electrodes of the plurality of dual-gate transistors.

Based upon the same inventive idea, the embodiments of the disclosure further provide a display panel which includes the array substrate above according to the embodiments of the disclosure.

In a particular implementation, when the display panel is a liquid crystal display panel, it is difficult to make the liquid crystal display panel thinned because thickness thereof becomes large due to a backlight source arranged therein, so if a pressure-sensitive component and a dual-gate transistor are integrated into the liquid crystal display panel, sensitivity and precision of pressure detection may drop and even disappear as the thickness of the liquid crystal display panel is increasing. Accordingly in the display panel above according to the embodiments of the disclosure, the display panel is generally a light and thin electroluminescent display panel, and preferably an organic electroluminescent display panel, and further preferably a flexible organic electroluminescent display panel, to thereby maximum the sensitivity and the precision of the pressure detection.

Based upon the same inventive idea, the embodiments of the disclosure further provide a display device including the display panel above according to the embodiments of the disclosure. The display device can be a mobile phone, a tablet computer, a TV set, a monitor, a notebook computer, a digital photo frame, a navigator, or any other product or component with a display function. Reference can be made to the embodiments of the display panel above for implementations of the display device, and a repeated description thereof will be omitted here.

The embodiments of the disclosure provide an array substrate, a method for fabricating the same, a display panel, and a display device, where the array substrate includes: a base substrate, a pressure-sensitive component, a plurality of dual-gate transistors and a plurality of pixel transistors; the pressure-sensitive component includes a first electrode layer, a pressure-sensitive layer, and a second electrode layer which are arranged on the base substrate in that order, and the second electrode layer includes a plurality of second electrodes arranged corresponding to the plurality of dual-gate transistors in a one-to-one manner; and the plurality of dual-gate transistors and the plurality of pixel transistors are arranged above the second electrode layer, and each of the plurality of second electrodes is electrically connected with a bottom-gate electrode in a corresponding dual-gate transistor. Accordingly the array substrate according to the embodiments of the disclosure is integrated with both the pressure-sensitive component and the dual-gate transistors so that precision of pressure detection can be greatly improved, and since the pressure-sensitive layer in the pressure-sensitive component is arranged between the dual-gate transistors and the base substrate, the pressure-sensitive layer will not be patterned to thereby simplify a fabrication process of the array substrate; and since both the dual-gate transistors and the pixel transistors are located above the second electrode layer, they can be fabricated together while the array substrate is being fabricated, to thereby reduce in effect the number of masks in use, simplify a fabrication process, and lower a fabrication cost.

Evidently those skilled in the art can make various modifications and variations to the invention without departing from the spirit and scope of the disclosure. Thus the invention is also intended to encompass these modifications and variations thereto so long as the modifications and variations come into the scope of the claims appended to the invention and their equivalents.

The invention claimed is:

1. An array substrate, comprising: a base substrate, a pressure-sensitive component, a plurality of dual-gate transistors, and a plurality of pixel transistors, wherein:
   the pressure-sensitive component comprises a first electrode layer, a pressure-sensitive layer, and a second electrode layer which are arranged on the base substrate in that order, and the second electrode layer comprises a plurality of second electrodes arranged corresponding to the plurality of dual-gate transistors in a one-to-one manner; and
   the plurality of dual-gate transistors and the plurality of pixel transistors are arranged above the second electrode layer, and each of the plurality of second electrodes is electrically connected with a bottom-gate electrode in a corresponding dual-gate transistor.

2. The array substrate according to claim 1, wherein source-drain electrodes of the plurality of pixel transistors are arranged at a same layer as source-drain electrodes of the plurality of dual-gate transistors, active layers of the plurality of pixel transistors are arranged at a same layer as active layers of the plurality of dual-gate transistors, and gate electrodes of the plurality of pixel transistors are arranged at a same layer as top-gate electrodes or bottom-gate electrodes of the plurality of dual-gate transistors.

3. The array substrate according to claim 2, wherein the plurality of pixel transistors are top-gate transistors, and the gate electrodes of the plurality of pixel transistors are arranged at the same layer as the top-gate electrodes of the plurality of dual-gate transistors.

4. The array substrate according to claim 3, wherein each of the plurality of second electrodes is arranged at a same layer as, and structured integral to, a bottom-gate electrode electrically connected therewith.

5. The array substrate according to claim 2, wherein the plurality of pixel transistors are bottom-gate transistors, and the gate electrodes of the plurality of pixel transistors are arranged at the same layer as the bottom-gate electrodes of the plurality of dual-gate transistors.

6. The array substrate according to claim 5, wherein each of the plurality of second electrodes is electrically connected with the bottom-gate electrode in the corresponding dual-gate transistor through a via-hole.

7. The array substrate according to claim 1, wherein orthographic projections of the plurality of second electrodes onto the base substrate do not overlap with orthographic projections of source-drain electrodes in the plurality of dual-gate transistors onto the base substrate.

8. The array substrate according to claim 1, wherein the first electrode layer is arranged on an entire surface of the base substrate as a whole.

9. The array substrate according to claim 1, wherein the first electrode layer comprises a hollow region in an area corresponding to an active layer of each of the plurality of pixel transistors.

10. The array substrate according to claim 1, wherein the pressure-sensitive layer is arranged on an entire surface of the base substrate as a whole.

11. The array substrate according to claim 1, wherein the pressure-sensitive layer comprises a hollow area, and an orthographic projection of the hollow area onto the base substrate does not overlap with orthographic projections of the plurality of second electrodes onto the base substrate.

12. The array substrate according to claim 1, wherein a material of the pressure-sensitive layer is a piezoelectric material; and
   the first electrode layer is configured to be applied with a first constant potential;
   each of the plurality of second electrodes is configured to apply a potential difference occurred when the piezoelectric material is being subjected to a pressure to the bottom-gate electrode in the corresponding dual-gate transistor;
   a top-gate electrode and a source electrode in each of the plurality of dual-gate transistors are configured to be applied with a second constant potential; and
   a drain electrode in each of the plurality of dual-gate transistors is configured to output a first pressure sensing potential.

13. The array substrate according to claim 1, wherein a material of the pressure-sensitive layer is a piezoresistive material; and
   the first electrode layer is configured to be applied with a first constant potential through a divider resistance;
   each of the plurality of second electrodes is configured to apply a potential difference occurred when the piezoresistive material is being subjected to a pressure to the bottom-gate electrode in the corresponding dual-gate transistor;
   a top-gate electrode and a source electrode in each of the plurality of dual-gate transistors are configured to be applied with a third constant potential; and
   a drain electrode in each of the plurality of dual-gate transistors is configured to output a second pressure sensing potential.

14. A display panel, comprising an array substrate, wherein the array substrate compmrises:
   a base substrate, a pressure-sensitive component, a plurality of dual-gate transistors, and a plurality of pixel transistors, wherein:
   the pressure-sensitive component comprises a first electrode layer, a pressure-sensitive layer, and a second electrode layer which are arranged on the base substrate in that order, and the second electrode layer comprises a plurality of second electrodes arranged corresponding to the plurality of dual-gate transistors in a one-to-one manner; and
   the plurality of dual-gate transistors and the plurality of pixel transistors are arranged above the second electrode layer, and each of the plurality of second electrodes is electrically connected with a bottom-gate electrode in a corresponding dual-gate transistor.

15. The display panel according to claim 14, wherein the display panel is a flexible organic electroluminescent display panel.

16. A display device, comprising the display panel according to claim 14.

17. A method for fabricating the array substrate according to claim 1, the method comprising:
- fabricating the first electrode layer, the pressure-sensitive layer, and the second electrode layer constituting the pressure-sensitive component on the base substrate in that order, wherein the second electrode layer comprises the plurality of the second electrodes; and
- fabricating the plurality of pixel transistors, and the plurality of the dual-gate transistors concurrently on the second electrode layer, wherein the plurality of dual-gate transistors are arranged corresponding to the plurality of second electrodes in a one-to-one manner, and each of the plurality of second electrodes is electrically connected with a bottom-gate electrode in a corresponding dual-gate transistor.

18. The method according to claim 17, wherein when the plurality of pixel transistors are top-gate transistors, fabricating the second electrode layer on the pressure-sensitive layer comprises:
- fabricating bottom-gate electrodes of the plurality of dual-gate transistors, and the second electrode layer respectively on the pressure-sensitive layer.

19. The method according to claim 18, wherein fabricating the plurality of pixel transistors, and the plurality of dual-gate transistors concurrently on the second electrode layer comprises:
- fabricating active layers of the plurality of pixel transistors, and active layers of the plurality of dual-gate transistors respectively on the second electrode layer;
- fabricating a gate insulation layer on the active layers of the plurality of pixel transistors, and the active layers of the plurality of dual-gate transistors;
- fabricating top-gate electrodes of the plurality of pixel transistors, and top-gate electrodes of the plurality of dual-gate transistors respectively on the gate insulation layer;
- fabricating an interlayer insulation layer on the top-gate electrodes of the plurality of pixel transistors, and the top-gate electrodes of the plurality of dual-gate transistors; and
- fabricating source-drain electrodes of the plurality of pixel transistors, and source-drain electrodes of the plurality of dual-gate transistors respectively on the interlayer insulation layer.

20. The method according to claim 17, wherein when the plurality of pixel transistors are bottom-gate transistors, fabricating the plurality of the pixel transistors, and the plurality of dual-gate transistors concurrently on the second electrode layer comprises:
- fabricating bottom-gate electrodes of the plurality of the pixel transistors, and bottom-gate electrodes of the plurality of dual-gate transistors respectively on the second electrode layer, wherein the bottom-gate electrodes of the plurality of dual-gate transistors are electrically connected with corresponding second electrodes through via-holes;
- fabricating a gate insulation layer on the bottom-gate electrodes of the plurality of pixel transistors, and the bottom-gate electrodes of the plurality of dual-gate transistors;
- fabricating active layers of the plurality of pixel transistors, and active layers of the plurality of dual-gate transistors respectively on the gate insulation layer;
- fabricating an interlayer insulation layer on the active layers of the plurality of pixel transistors, and the active layers of the plurality of dual-gate transistors;
- fabricating source-drain electrodes of the plurality of pixel transistors, and source-drain electrodes of the plurality of dual-gate transistors respectively on the interlayer insulation layer; and
- fabricating top-gate electrodes on the source-drain electrodes of the plurality of dual-gate transistors.

* * * * *